United States Patent
Safariforoshani et al.

(10) Patent No.: US 10,132,147 B2
(45) Date of Patent: Nov. 20, 2018

(54) SYSTEM AND METHOD FOR MODELING AND DESIGN OF PULSE FRACTURING NETWORKS

(71) Applicant: Weatherford Technology Holdings, LLC, Houston, TX (US)

(72) Inventors: Mohammadreza Safariforoshani, Houston, TX (US); Jian Huang, Houston, TX (US); Sunil Lakshminarayanan, Houston, TX (US); Ovunc Mutlu, Houston, TX (US)

(73) Assignee: Weatherford Technology Holdings, LLC, Houston, TX (US)

( * ) Notice: Subject to any disclaimer, the term of this patent is extended or adjusted under 35 U.S.C. 154(b) by 800 days.

(21) Appl. No.: 14/322,516

(22) Filed: Jul. 2, 2014

(65) Prior Publication Data
US 2016/0003019 A1    Jan. 7, 2016

(51) Int. Cl.
*E21B 43/26* (2006.01)
(52) U.S. Cl.
CPC ................... *E21B 43/26* (2013.01)
(58) Field of Classification Search
CPC ..................................... E21B 43/26
See application file for complete search history.

(56) References Cited

U.S. PATENT DOCUMENTS

| | | | |
|---|---|---|---|
| 5,050,674 A | 9/1991 | Soliman et al. | |
| 6,364,015 B1 | 4/2002 | Upchurch | |
| 7,559,373 B2 * | 7/2009 | Jackson | E21B 43/26 166/308.1 |
| 2007/0272407 A1 * | 11/2007 | Lehman | E21B 43/26 166/250.1 |
| 2008/0183451 A1 * | 7/2008 | Weng | E21B 43/26 703/10 |
| 2011/0017458 A1 * | 1/2011 | East, Jr. | E21B 43/26 166/308.1 |

(Continued)

FOREIGN PATENT DOCUMENTS

| | | |
|---|---|---|
| EA | 006335 B1 | 12/2009 |
| EA | 15181 B1 | 6/2011 |

(Continued)

OTHER PUBLICATIONS

R.P. Swift, A.S. Kusubov, "Multiple Fracturing of Boreholes by Using Tailored-Pulse Loading", SPE Journal, vol. 22, pp. 923-932 (Dec. 1982).*

(Continued)

*Primary Examiner* — Kamini S Shah
*Assistant Examiner* — Steven W Crabb
(74) *Attorney, Agent, or Firm* — Blank Rome, LLP

(57) ABSTRACT

Systems and methods for analyzing and designing a customized pulse fracturing operation for fracturing a wellbore in a reservoir formation are disclosed. Pulsed fracturing can create multiple fractures that radiate away from the wellbore while minimizing near wellbore damage. This network can further be extended into the reservoir by utilizing an optimized pumping rate over a predetermined amount of time. The optimized pulse rate and duration can be determined by using a geomechanical and a reservoir simulator which can help in quantifying the production efficiency of the induced fracture network.

33 Claims, 15 Drawing Sheets

(56) References Cited

U.S. PATENT DOCUMENTS

| | | | | |
|---|---|---|---|---|
| 2012/0310613 A1* | 12/2012 | Moos | ............... | G01V 11/00 |
| | | | | 703/10 |
| 2014/0352949 A1* | 12/2014 | Amendt | ............. | E21B 43/26 |
| | | | | 166/250.1 |
| 2015/0114623 A1* | 4/2015 | Owens | ............ | E21B 43/2405 |
| | | | | 166/248 |

FOREIGN PATENT DOCUMENTS

| | | |
|---|---|---|
| RU | 2417315 C2 | 4/2011 |
| RU | 2486336 C2 | 6/2013 |

OTHER PUBLICATIONS

PCT Search Report in co-pending PCT Application No. PCT/US0215/037866, dated Sep. 10, 2015, 11 Pages.

SPE 167107, "Integrating Reservoir and Geomechanical Models to Compare the Productivity of Shale Reservoirs Using Different Fracture Techniques," S. Lakshminarayanan, R. Jayakumar, M. R. Safari, Jian Huang, R. Rai, S. Christian and U. Mutlu, Weatherford Hazim Abass, ARAMCO, Society of Petroleum Engineers, SPE Unconventional Resources Conference and Exhibition—Asia Pacific, Brisbane, Australia, Nov. 11-13, 2013, 10 Pages.

SPE 168759/URTec 1579760,"Pulsed Fracturing in Shale Reservoirs: Geomechanical Aspects, Ductile-Brittle Transition and Field Implications," M. Reza Safari*, Raju Gandikota, Uno Mutlu, Weatherford, Missy Ji, Jonathan Glanville, ANSYS, Hazim Abass, ARAMCO, Unconventional Resources Technology Conference (URTeC), Denver, Colorado, USA Aug. 12-14, 2013, 14 Pages.

Office Action and Search Report in counterpart RU Appl. 2017103298, dated Feb. 19, 2018, 12-pgs.

* cited by examiner

SYSTEM AND METHOD FOR MODELING AND DESIGN OF PULSE FRACTURING NETWORKS

TECHNICAL FIELD

This disclosure relates generally to the field of fracturing a wellbore in a subterranean formation and in particular to methods and systems for improving fracturing techniques.

BACKGROUND

A common technique utilized to maximize production from permeability challenged reservoirs is fracturing. Fracturing involves creating fractures in the formation along which gas, petroleum or brine may migrate to the well. The most common form of fracturing is referred as hydraulic fracturing which often involves injecting a high pressure liquid mixed with sand and chemicals into the formation. In general, hydraulic fracturing involves a relatively slow rate of loading on surrounding rock and results in bi-wing fracture geometries which limit reservoir contact area. Although it is the most common form of fracturing used, hydraulic fracturing may not be the most efficient. For example, generally only about 20-30% of the injected liquid used for hydraulic fracturing is recovered during clean-up, making the process highly inefficient.

To overcome some of the limitations of hydraulic fracturing techniques and to further increase reservoir contact area alternative fracturing techniques such as, tunnel or cavity collapse, gas fracturing, propellant fracturing, explosive fracturing, or thermal fracturing may be considered. However, only a few of these alternative techniques have been utilized successfully in the field because each technique has its own difficulties and limitations.

For example, the alternate fracturing technique referred to as explosive fracturing involves very rapid loading of the formation and may result in simultaneous propagation of multiple fractures. However, due to extreme stress and heat generated during the explosion, near wellbore region might reach plastic flow or compaction limit.

Thus, currently used fracturing techniques have shortcomings that might be addressed by exploring other fracturing techniques. The following disclosure addresses these and other issues.

SUMMARY

In one embodiment a non-transitory program storage device, readable by a processor is provided. The non-transitory program storage device includes instructions stored thereon to cause one or more processors to receive a plurality of input parameters, each input parameter relating to a reservoir formation, to develop a pressure and rate dependent failure model, and to simulate propagation of a pulse fracturing network in the reservoir formation by applying one or more pulse fracturing techniques to maximize fracture network extent while minimizing near wellbore damage.

In another embodiment, a method for designing a pulse fracturing operation is provided. The method includes receiving a plurality of input parameters, each input parameter relating to a wellbore in a reservoir formation, developing a pressure and rate dependent failure model based on the received input parameters, and simulating propagation of a pulse fracturing network in the reservoir formation by applying one or more pulse fracturing techniques to maximize fracture network extent while minimizing near wellbore damage.

In yet another embodiment, a system is provided. The system includes, in one embodiment, a memory, a display device, and a processor operatively coupled to the memory and the display device and adapted to execute program code stored in the memory. The program code is executed to receive a plurality of input parameters, each input parameter relating to a wellbore in a reservoir formation, to develop a pressure and rate dependent failure model, and to simulate propagation of a pulse fracturing network in the reservoir by applying one or more pulse fracturing techniques to maximize fracture network extent while minimizing near wellbore damage.

DESCRIPTION OF DISCLOSED EMBODIMENTS

In the following description, for purposes of explanation, numerous specific details are set forth in order to provide a thorough understanding of the inventive concept. As part of this description, some of this disclosure's drawings represent structures and devices in block diagram form in order to avoid obscuring the invention. Reference in this disclosure to "one embodiment" or to "an embodiment" means that a particular feature, structure, or characteristic described in connection with the embodiment is included in at least one embodiment of the invention, and multiple references to "one embodiment" or "an embodiment" should not be understood as necessarily all referring to the same embodiment.

It will be appreciated that in the development of any actual implementation (as in any development project), numerous decisions must be made to achieve the developers' specific goals (e.g., compliance with system- and business-related constraints), and that these goals will vary from one implementation to another. It will also be appreciated that such development efforts might be complex and time-consuming, but would nevertheless be a routine undertaking for those of ordinary skill in the art of data processing having the benefit of this disclosure.

Figure 1A:
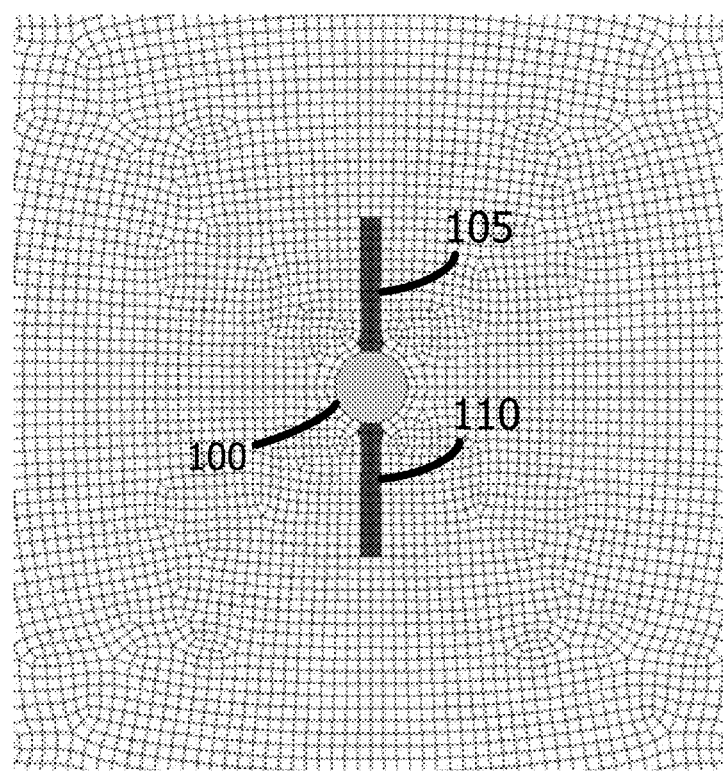
FIG. 1A shows exemplary bi-wing fracture propagation and damage around the wellbore created by applying a hydraulic fracturing operation.

In permeability challenged reservoirs, one of the primary goals of a fracturing operation is to create an extensive and well-connected fracture network that can remain open during production. Hydraulic fracturing has been the most widely used technique to create fractures in subsurface. The process of hydraulic fracturing generally involves a relatively slow rate of loading applied to a reservoir formation and a single cycle of loading (pump and shut-in) for single or multi-stages. However, not all formations respond well to this type of fracturing. For example, the slow loading rate may result in bi-wing fracture patterns and limited reservoir contact area in some formations. Moreover, hydraulic fracturing typically produces one single fracture aligned with the maximum principal in-situ stress direction. FIG. 1A illustrates a bi-wing fracture created using hydraulic fracturing. As can be seen, only two fractures 105 and 110 propagating away from the wellbore 100 were created, and due to the slow loading of hydraulic fracturing, the damage is limited to the opening mode.

Figure 1B:
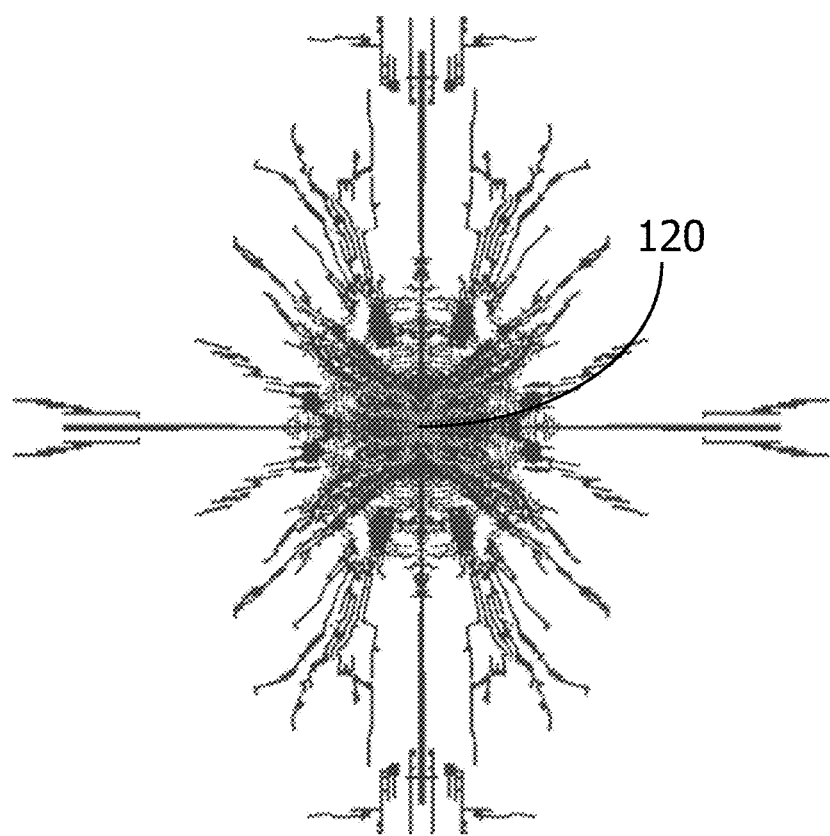
FIG. 1B shows an exemplary induced fracture network and damage around the wellbore created by applying an explosive fracturing operation.

An alternative fracturing technique sometimes used is explosive fracturing which often involves rapid loading of formation that can trigger simultaneous propagation of multiple fractures. However, due to the excessive amount of stress and heat that is often generated during the explosion, the near wellbore region may reach a plastic flow and compaction limit which may inhibit fracture growth away from the wellbore. Thus, fractures created by explosive fracturing may have a peak pressure that is orders of magnitude above in-situ stresses and may cause compaction around the wellbore. FIG. 1B illustrates compaction and damage around a wellbore due to high energy explosives used in explosive fracturing. As shown, the stressed caused by the explosion can cause extensive damage to the wellbore 120. In this case, stress state may dictate the total damage, and failure of the wellbore may occur. Therefore, although creating more fractures, explosive fracturing has its own limitations. Thus, a fracturing technique with a loading rate that is faster than hydraulic fracturing but smaller than explosive fracturing may be needed. Pulse fracturing can provide such an option.

Pulse fracturing loading rates and peak loads (generally provided via high energy gas or propellants burning inside wellbore) can be customized to lie in between hydraulic and explosive fracturing. In this manner, the pulse fracturing technique has the potential to shatter ductile shale by triggering a ductile to brittle transition at an optimized pulse rate and peak load at a certain reservoir condition while minimizing near wellbore damage, thus avoiding limitations inherent in both hydraulic and explosive fracturing.

Figure 1C:
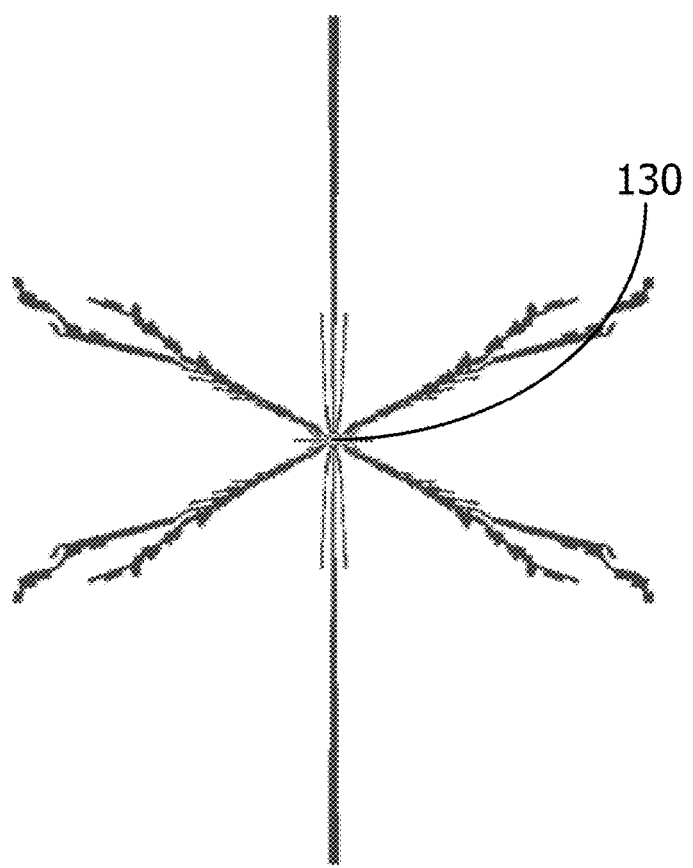
FIG. 1C shows an exemplary induced fracture network created by applying an optimized pulse fracturing operation.

Pulse fracturing can create a load that is about an order of magnitude above the in-situ stress level but might stay below the plastic and/or compaction limit of the reservoir formation, as multiple radial fractures develop and propagate around the wellbore. FIG. 1C illustrates an exemplary network of induced fractures created by applying optimized pulse fracturing. As can be seen, multiple radial fractures propagating away from the wellbore 130 are created due to pulse loading and near wellbore damage is minimized.

An induced fracture network by applying pulse fracturing can be enhanced by use of geomechanical and reservoir models to predict the generated fracture networks, to quantify the productivity and efficiency of these induced fracture networks, and to tailor the fracturing technique according to the predicted results.

The induced fracture potential of a reservoir rock, also referred to as fracability or brittleness, may be defined as the ability of the rock to create high quality, extensive and complex fracture networks that can remain open during production. High fracture potential increases the efficiency of fracturing or re-fracturing operations. Therefore, prediction of this potential is an important prerequisite for different fracturing technologies where success depends on the quality of the induced fracture network. The fracturing potential is generally controlled by different variables. These variables include rate dependent material properties, in-situ stress state and loading conditions, texture or natural fracture characteristics of the host rock, and available technology and equipment. Since some of these variables can be altered to enhance the fracturing process, accurate knowledge of these variables may be useful in an improved fracturing technique. For example, material properties or responses can be modified by rock-fluid interactions, adjusting loading rates, loading cycles or load pulses, or by utilizing extreme temperatures that might trigger vitrification. In-situ stress state and stress anisotropy can be controlled or overridden, for example, by utilizing depletion and/or injection induced stress changes, high rate pulses or explosions, thermal effects, or stress shadows due to multi-stage fractures. Natural fracture characteristics and rock texture may be difficult to modify, but their reactivation potential can still be maximized. Improvements in equipment design can provide pressure pumping technology that could help overcome some of the limitations imposed by in-situ properties and stress state. Therefore with the use of the right technology and design, induced fracture potential can be modified for a given reservoir formation.

In brittle failure, reservoir formation may respond to applied strain by fracturing. In contrast, ductile failure may dictate that the material will accommodate strain by flowing or plastic deformation (i.e. low ratio(s) of elastic to plastic strain). That is, in ductile failure, more energy may be absorbed as fracture toughness increases. This failure phenomenon may be controlled by a combination of parameters which include stress state, rate of loading and failure properties of the rock (e.g. critical energy release rate, cohesion, internal friction angle, compressive and tensile strength).

Some field observations suggest that shale is most likely to fracture if it has a high Young's modulus and low Poisson's ratio. However, both Young's modulus and Poisson's ratio are elastic properties. They do not relate to fracturing and failure as standalone parameters. Although these properties might tell how stresses evolve elastically, they contain little information on post-peak fracturing potential. That is, an elastically softer material (e.g. with a low Young's modulus and high Poisson's ratio) can experience brittle failure as well. Thus, elastic properties may not always be considered as indicators of brittle or ductile behavior.

Utilizing strength parameters to predict fracture potential (i.e., tensile or unconfined compressive strength values) has similar characteristics. Strength is the load carrying capacity and may thus vary based on the level of confinement and loading rate. Thus, strength as a standalone parameter does not provide sufficient information to characterize the post-peak behavior of rocks. Indeed, rocks that have similar compressive or tensile strength values might exhibit a different post-peak behavior or magnitude of stress drop.

Experimental observations show that, rocks buried at shallow depths (i.e. low confining stress) or uplifted/eroded might still exhibit brittle failure regardless of the mineral content, if the stress state dictates that they should. That is, cyclic loading at shallow depths might lead to extensive fracturing in a formation that would otherwise be classified as ductile, in particular if the classification is based solely on mineral content.

Figure 2:
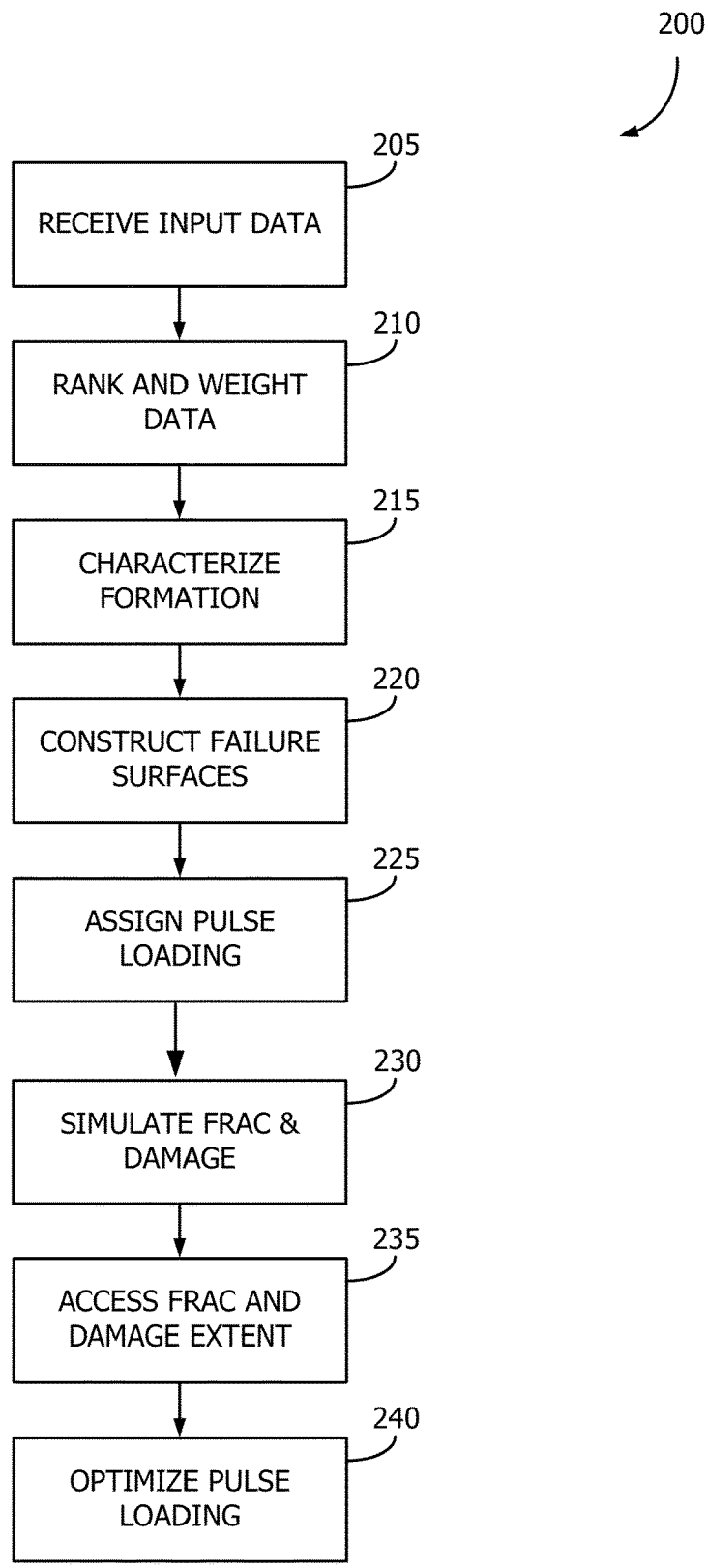
FIG. 2 is a flowchart illustrating an induced fracture network assessment operation, according to one or more disclosed embodiments.

Accordingly, fracture potential cannot be predicted based on single parameters. To accurately predict the fracture potential, an algorithm should be used that takes into account a variety of parameters and conditions. This may be done, in one embodiment, by using steps of operation 200 illustrated in the flowchart of FIG. 2. As shown, the process may begin by receiving input data from multiple sources (block 205). These sources may include field data, and data provided by cores or logs. The received data may include elasticity information, unconfined compressive strength (USC) information, data relating to mineral content, formation anisotropy (intrinsic variations, degree of laminations) and stress anisotropy, cohesion, friction angle, in-situ fracture toughness, plastic and failure properties, rate dependency, and natural fracture reactivation potential of the target formation.

The received data may then be ranked and weighted according to a predetermined system that quantifies the impact and/or reliability of the received data (block 210). For example, elasticity information may be ranked lower than stress anisotropy because the elasticity data may be determined to be less reliable or has less impact to the analysis. Similarly, stress anisotropy information may receive a lower ranking than cohesion or friction angle data due to the information being determined less reliable than the cohesion or friction angle data. This ranking is illustrated in FIG. 3.

Once all of the received data is weighted and ranked, formation can be qualitatively characterized based on the received data as either brittle or ductile (block 215). Next a failure model may be developed based on the data (block 220). In one embodiment, this failure model is an advanced constitutive model that integrates multiple modes of failure based on the ranked and weighted data to provide a pressure and rate dependent failure surface that can quantify fracture behavior of reservoir formation with implications for alternative fracturing techniques such as pulse fracturing. For example, the failure model may predict failure surfaces (block 220) and also predict type of damage (i.e. tensile, shear and compactive failure). The model may also simulate porous compaction, strain softening in tension and compression, and strain rate hardening in compression.

In one embodiment, parameters used to construct the failure model include shear modulus, compressive strength, tensile strength, shear strength, intact rock cohesion, intact rock friction angle, tensile/compressive meridian ratio, brittle to ductile transition, ratio of elastic to plastic surfaces, fractured rock cohesion, fractured rock friction angle, compressive strain rate exponent, tensile strain rate exponent, maximum fracture strength ratio, damage control constant, minimum strain to failure, residual shear modulus fraction, principle tensile failure stress, and fracture energy. The failure model can then be used to assign pulse fracturing scenarios (block 225) to simulate and predict fracturing and damage around the wellbore (block 230). Based on the assessment of fracture and damage extent (block 235) for a specific formation, loading conditions (pulse fracturing increase rate and peak load) can be adjusted to optimize fracture complexity, extent and connectivity while minimizing damage around the wellbore (block 240). This optimized model then can be used to design pulse fracturing operations for upcoming wells.

Figure 3:
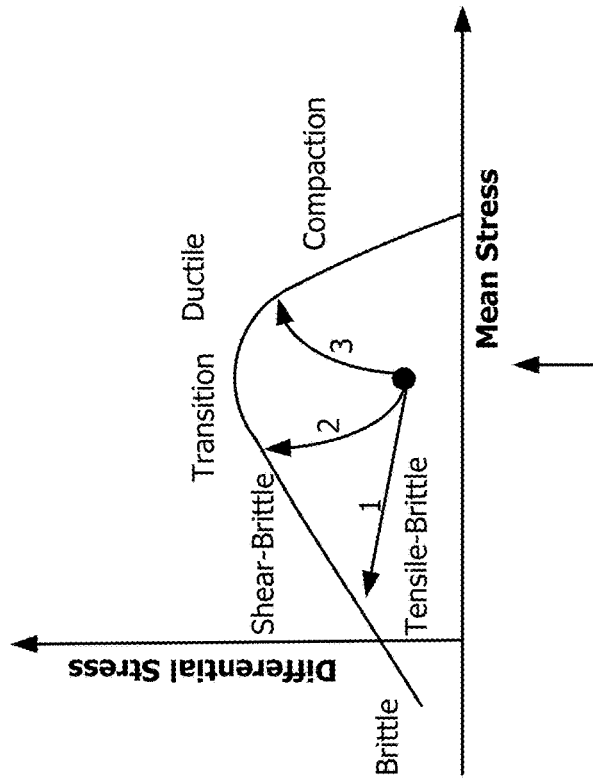
FIG. 3 provides a ranked list of potential input parameters used to construct a reservoir formation failure model and a graph showing brittle, ductile to brittle transition, and ductile failure modes.
Figure 3:
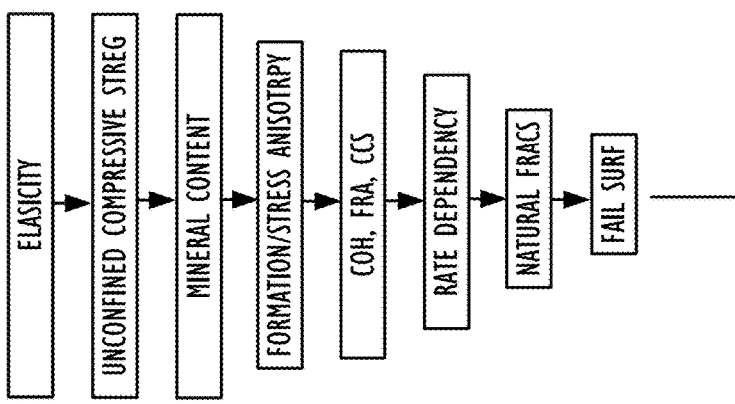

FIG. 3 provides a graph illustrating an example for prediction of tensile, shear and compactive failure. As shown, this graph quantifies ductile, brittle, and ductile to brittle transition zones, thus providing information that can be used in simulating pulse fracturing and predicting the resulting fracture network. The shear failure surface integrates plasticity and damage in which the ultimate deviatoric stress in the material may be limited by a failure surface defined by a specific formula. FIG. 3 also illustrates the ranking of input data parameters based on reliability in an ascending order. Thus, in this example illustration, the input parameters in the order of lowest reliability to highest reliability are: elasticity; unconfined compressive strength (USC); mineral content; formation/stress anisotropy; cohesion, friction angle, CCS, in-situ fracture toughness; rate dependency, natural fractures, and integrated failure surface. As shown the input parameters and their order of ranking is used to create the graph of prediction of tensile, shear and compactive failure.

Figure 4A:
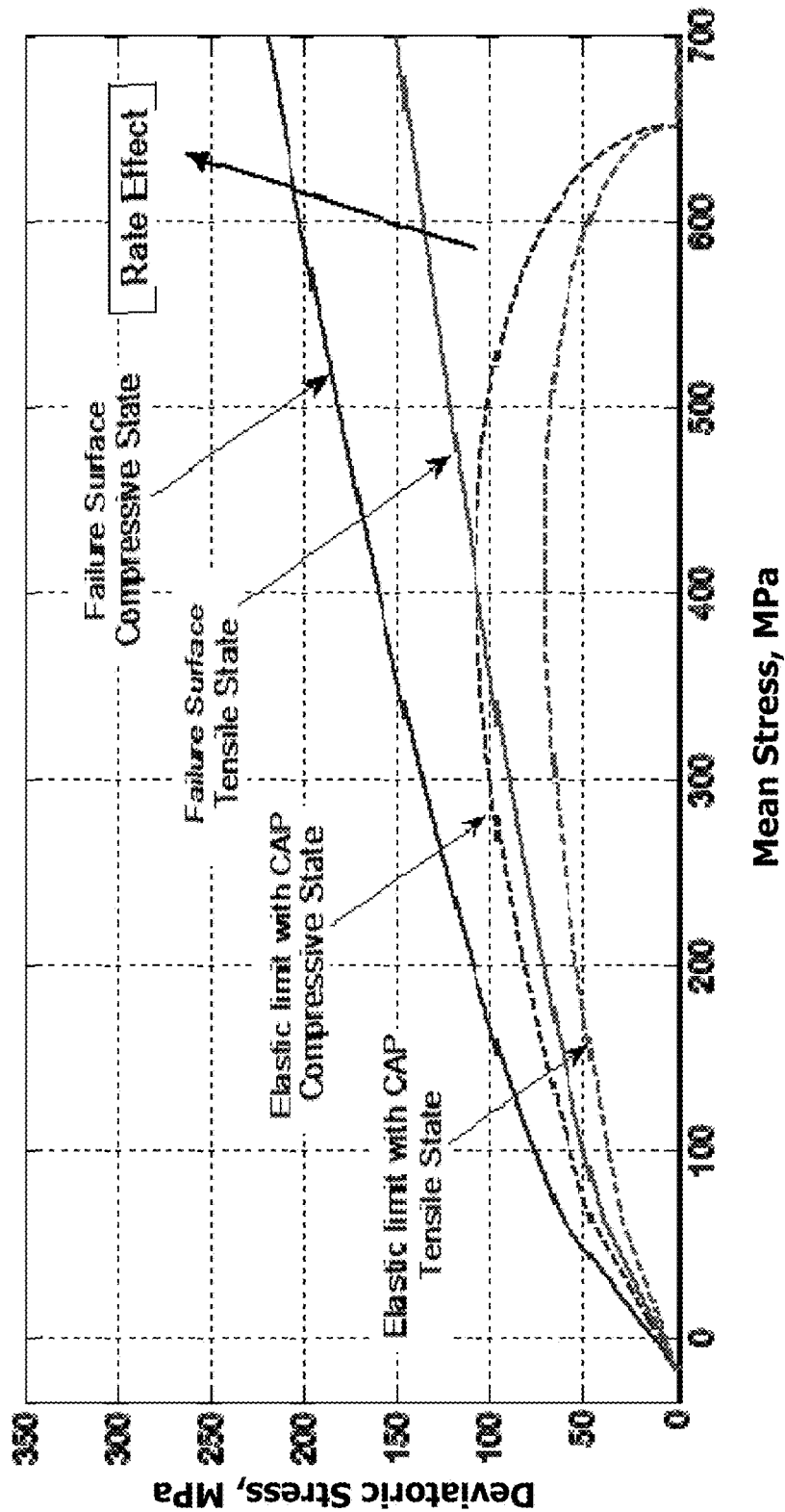
FIGS. 4A-4B illustrate graphs of failure models developed, according to one or more disclosed embodiments.

In one embodiment, the model may be modular in nature and may be designed such that individual components of the material behavior can be activated and deactivated. For example, rate dependency, damage or softening may be analyzed separately. In one embodiment, graphs may be utilized to display reservoir formation failure behavior. For example, as shown in FIG. 4A, the yield surface with elastic limit-cap and shear failure surfaces may be plotted in a graph of mean stress versus differential stress space. As shown in the figure, by increasing strain rate, failure surfaces would inflate and move away from mean stress axis. Thus, FIG. 4A shows plots of elastic limit with CAP tensile state, elastic limit with CAP compressive state, failure surface tensile state, failure surface compressive state and effect of strain rate in a graph of mean stress versus deviatoric stress. In one embodiment, shear failure surface may be both rate and pressure dependent and can evolve, when the stress state and rate dictate that it should. Once the peak strength is exceeded, a shear damage increment may be calculated and shear failure surface may be gradually reduced from the peak to a residual or frictional surface. In one embodiment, a combination of cyclic, static triaxial compression-extension tests, and split bar Hopkins tests may be used to provide essential input for the rate and pressure dependent failure surfaces calculated in the analysis.

Tensile failure may be modeled based on a limiting tensile stress criteria and a softening model that localizes damage. The parameters used for modeling tensile failure may include tensile strength and critical energy release rate of the material, among others. The limit of the tensile surface may be controlled by the tensile strength while damage evolution may be determined by critical energy release rate or fracture toughness.

Figure 4B:
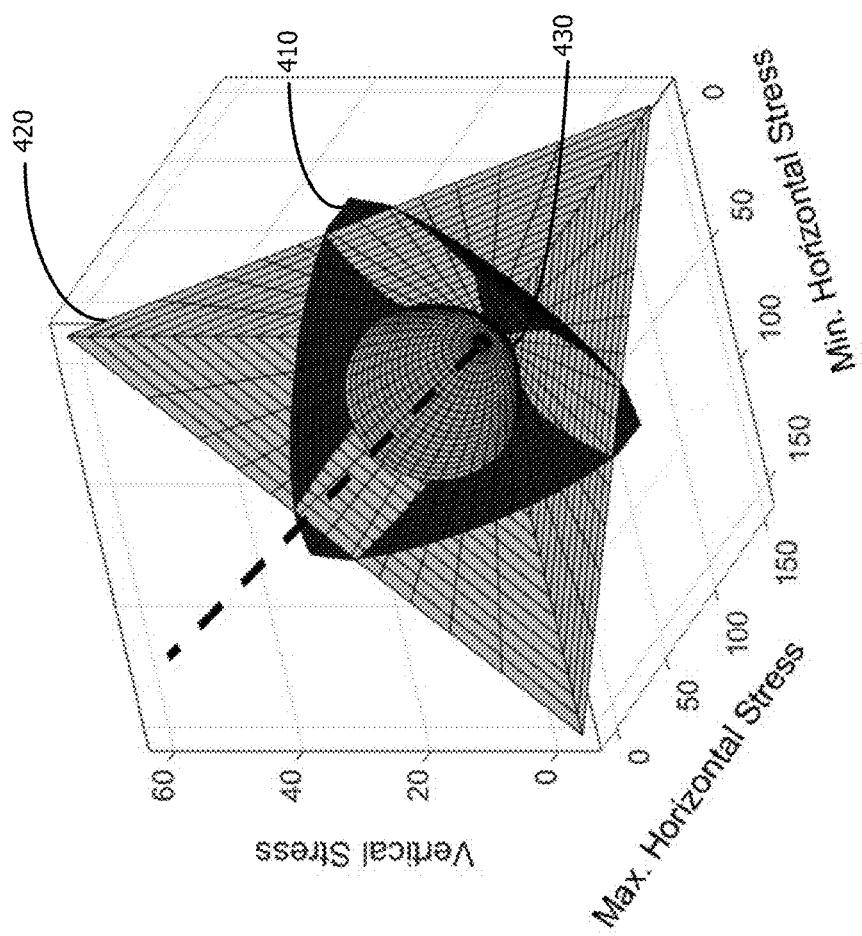

FIG. 4B shows an example graph that illustrates superposition of the tensile failure surface onto the rate and pressure dependent shear failure surface in principal stress space. The surface that limits the stress state is either the shear or tensile failure surface, whichever is the closest surface to the hydrostatic axis (dashed line). The shear failure surface 410 (dark gray surface in FIG. 4B) takes the form of a paraboloid in principal stress space and makes equal angles with the three principal stress axes. The tensile failure surface 420 intersects the paraboloid and produces three flattened surfaces on it. The tensile failure surfaces 420 are normal to the three principal stress axes and pressure independent, whereas the shear failure surface 410 is both pressure and rate dependent. FIG. 4B demonstrates a case where a relatively well pronounced tensile surface has developed which intersects with the shear surface. Other scenarios are also possible. The surface 430 in FIG. 4B represents the stress state where strength of material is reduced from a peak to residual level upon fracturing and failure.

Figure 5B:
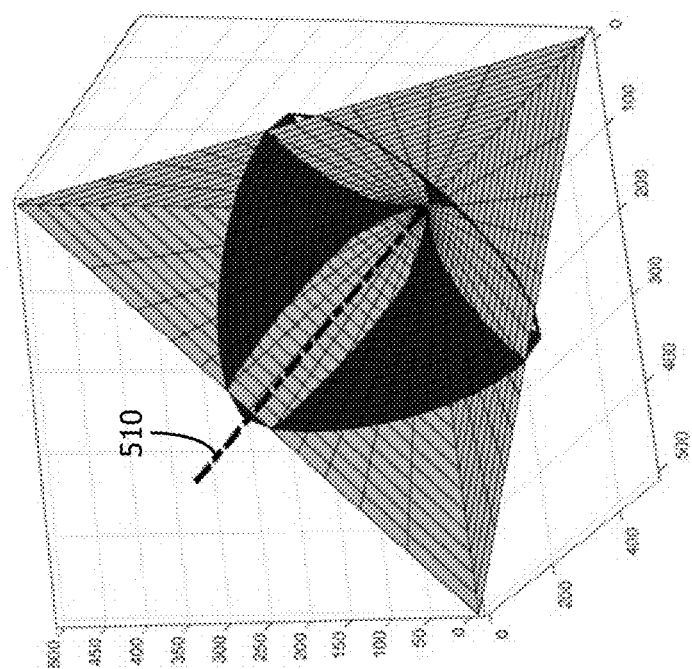
FIGS. 5A-5B are graphs illustrating effects of strain rate on integrated failure surfaces, according to one or more disclosed embodiments.
Figure 5A:
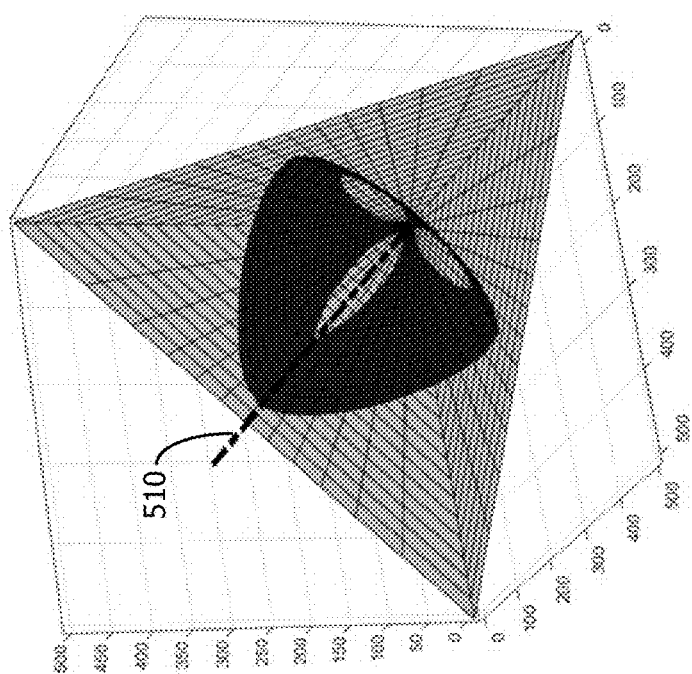
Figure 6B:
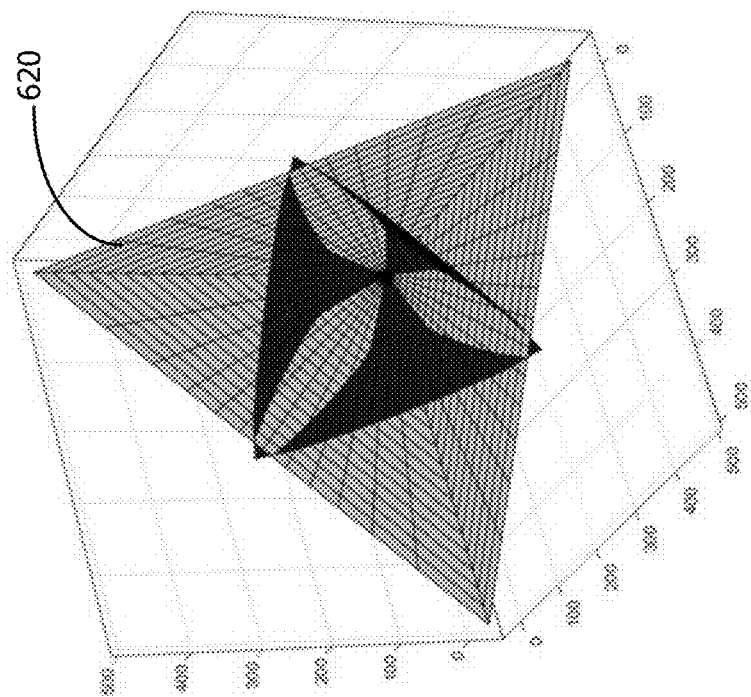
FIGS. 6A-6B are graphs illustrating effects of strength parameters on integrated failure surfaces, according to one or more disclosed embodiments.
Figure 6A:
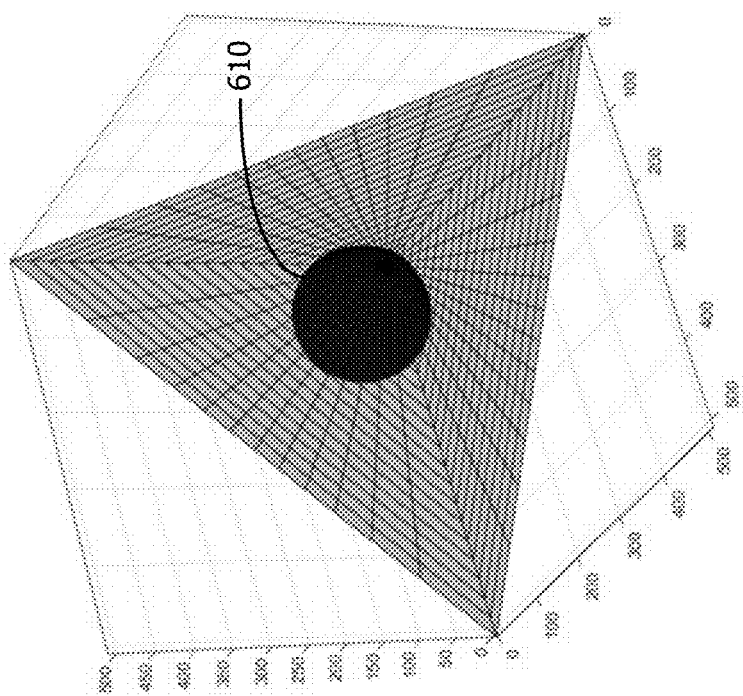

FIGS. 5A-5B illustrate examples of the effects of strain rate on integrated failure surfaces, and FIGS. 6A-6B illustrate examples of interdependent material strength parameters such as UCS, cohesion, friction angle, and tensile strength on shear failure surface geometry. A comparison between FIGS. 5A and 5B shows that by increasing strain rate from hydraulic fracturing (i.e., low rate) to pulse fracturing (i.e., high rate), the tensile failure surface may become dominant and closer to the hydrostatic axis 510 (strait line) in certain locations, thus resulting in a lower mean pressure. In addition, as shown in FIG. 6A-6B, high strength rock (i.e. high UCS, cohesion, friction angle, or tensile strength) may increase the chance of exhibiting brittle behavior. This is evident from the tensile versus shear failure surface interactions and their proximity to the hydrostatic axis in FIGS. 6A-6B. That is, if the rate and stress state dictates, stress path may have an increased probability of reaching the tensile failure surface 620 in FIG. 6B, while this probability in FIG. 6A is reduced by the proximity of the shear failure surface 610 with respect to the hydrostatic axis.

The inventors of this disclosure have found that for pulse fracturing, brittle-ductile transition may not only be dictated by the tensile failure surface but may also include portions of the rate and pressure dependent shear failure surface and its competition and interaction with the tensile surface. Thus, given values of material constants and the specific stress state which is imposed, one may determine whether the failure will be of ductile, brittle or in a transition mode. This may be done in one embodiment by simulating different pulse fracturing scenarios under a variety of stress states and rates for different material properties. Since ductile-brittle transition occurs at different scales in pulse fracturing, the results of such simulations could be used to customize a pulse fracturing operation accordingly.

Referring back to FIG. 2, the steps of operation 200 include such a simulation (block 230). Thus once the failure model has been developed, operation 200 may simulate fracture propagation and interaction in the induced fracture network. The simulation may predict a fracture network based on a given design. For example, different failure modes (e.g., tensile, shear and compaction) can be simulated under a variety of loading conditions to determine the best conditions to use for creating a fracture network. The simulation may use different input parameters to constructs compaction behavior, shear, residual, and tensile surfaces for an accurate representation of the resulting fracture patterns due to pulse.

Figure 7A:
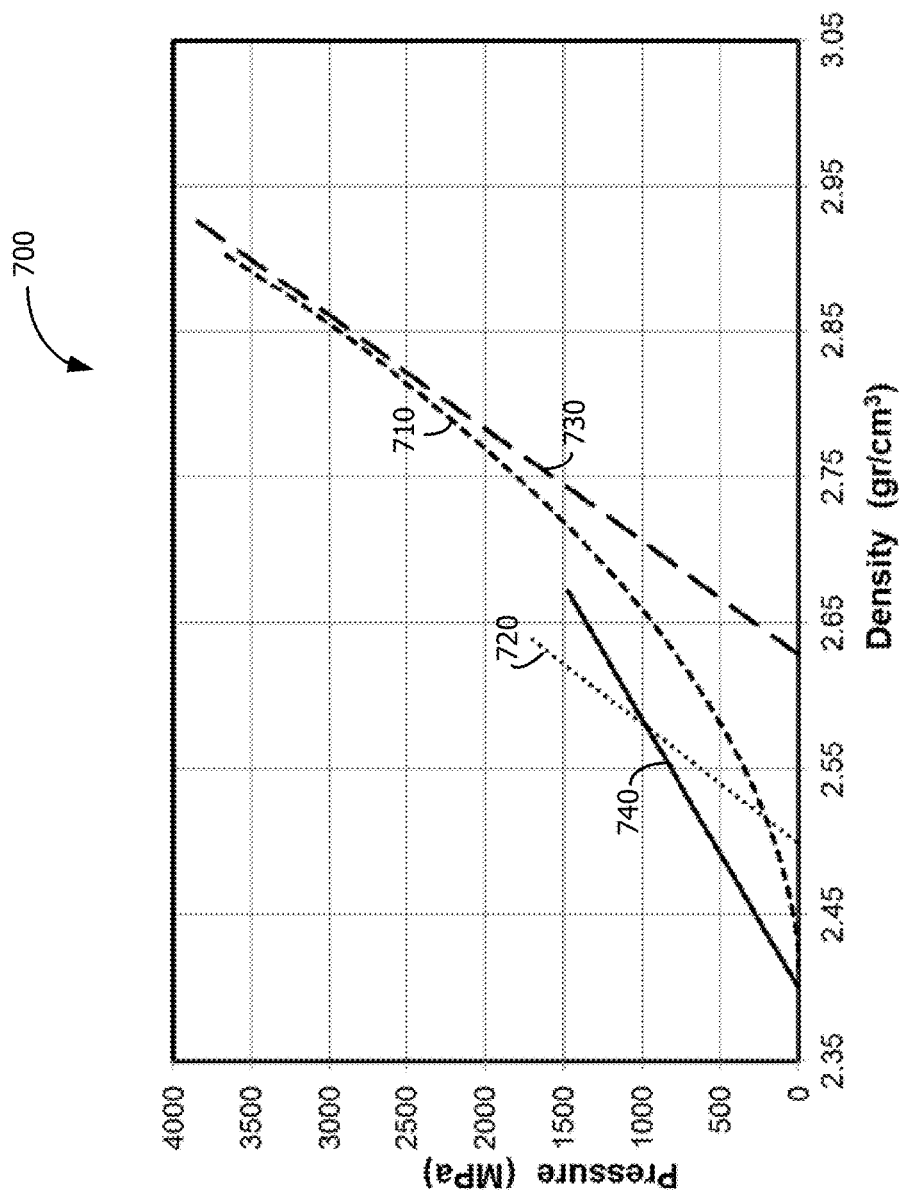
FIGS. 7A-7B are graphs illustrating simulation input to account for reservoir formation compaction response, according to one or more disclosed embodiments.
Figure 7B:
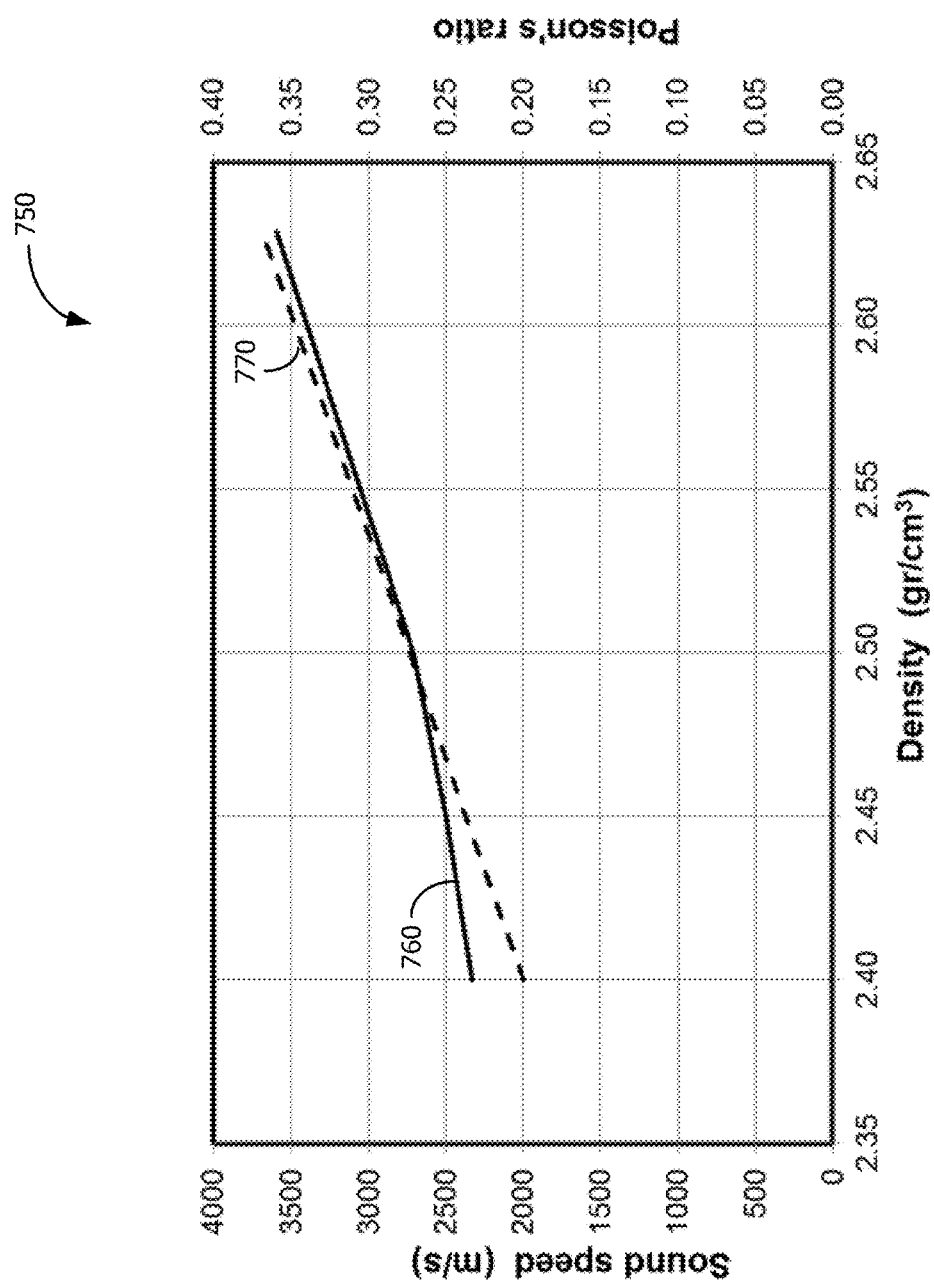

To simulate compaction behavior, a graph of pressure against density that illustrates a compaction path and a graph of sound speed against density that shows the elastic volumetric stiffness of the material as it compacts may be needed. FIG. 7A illustrates an example graph 700 of pressure against density for this purpose. As illustrated, the graph may show the compaction path 710, elastic response before compaction 720, rock grain elastic response 730, and the unloading path 740. FIG. 7B shows changes in elastic properties and density variations with sound speed. Thus, graph 750 of FIG. 7B plots bulk soundspeed 760 and Poission's Ratio 770.

In general, the fracture initiation/propagation geometry of the system depends upon pressure rise time, decay rate, maximum peak pressure achieved during the pulse event, and reservoir formation properties. Furthermore, formation shattering, branching and slipping along radially propagating fractures (i.e. at an angle to the in-situ stress field) could trigger a self-propping mechanism. Thus, by using the models disclosed herein, pulse load parameters may be optimized to achieve the most extensive fracture network and minimize near wellbore damage at the same time. For example, depending on reservoir properties, peak load magnitude, and rise and decay rates of pulse load can be customized to achieve a desired fracture pattern. Furthermore, customized loading conditions may be used to help minimize porosity and permeability damage.

Figure 8:
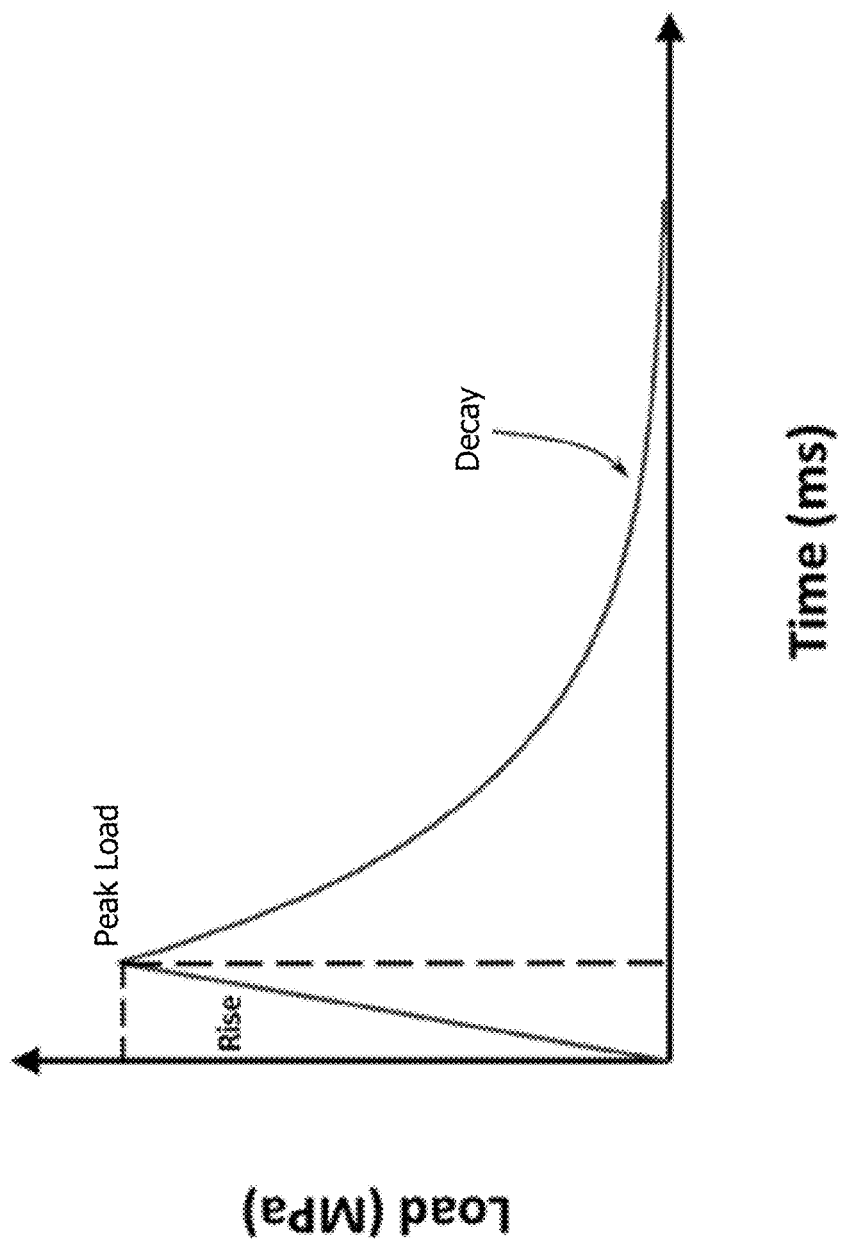
FIG. 8 is a graph of an exemplary customized dynamic pulse fracturing load applied to a wellbore, according to one or more disclosed embodiments.

In one embodiment, the customized dynamic pulse which may be applied to a wellbore can be represented by using a linear pressure rise followed by an exponential fall. This is illustrated in the graph of FIG. 8. In this embodiment, peak load and rise time may be varied, while decay exponent is kept constant.

The customized dynamic pulse may be in the order of milliseconds to create and extend multiple fractures radially away from the wellbore. After the application of the pulse-rise period, which may create multiple initial fractures, several post peak scenarios can be pursued as shown in FIG. 9A. The first scenario may be to use a pulse source (e.g. multiple propellants) that provides an increased decay time and continued gas penetration during post-peak. This process may be referred to as pulse-long-decay (PLD). Alternatively, a limited amount of gas may be seeped into the created initial fractures. This may be referred to as pulse-short-decay (PSD). Gas may also be pumped at a much reduced rate into the initially created fracture network (after pulse loading) for an extended amount of time. This may be referred to as pulse extended-gas (PEG). Each of these processes may lead to a different characteristic fracture network. Thus each may be simulated to study the results to determine which process best serves the needs of the fracturing operation.

Figure 9B:
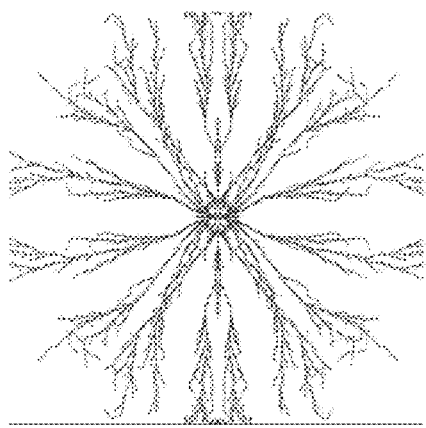
FIGS. 9A-9C show a graph illustrating different pulse fracturing techniques and the resulting fracture networks, according to one or more disclosed embodiments.
Figure 9C:
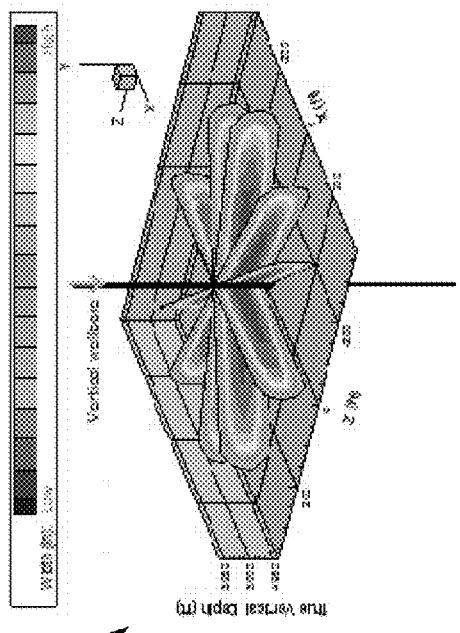
Figure 9A:
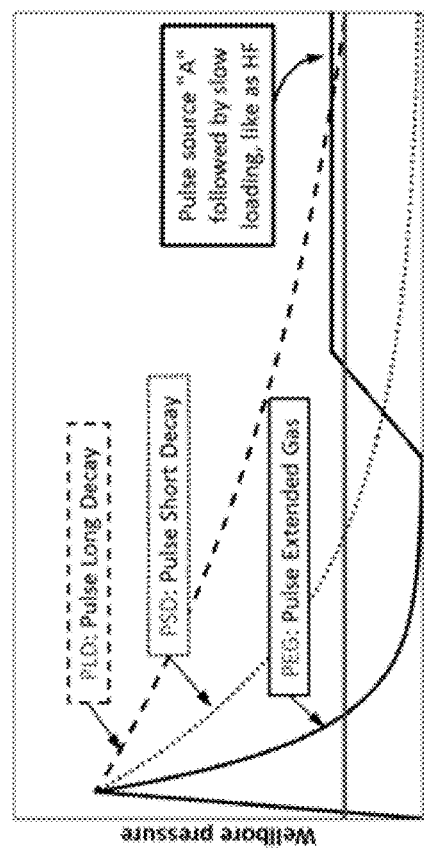

This is illustrated in FIGS. 9A-9C where PLD, PEG and PSD scenarios are considered to optimize the pulse rate and peak to maximize fracture complexity and connectivity. As shown in the figure, by simulating the various scenarios and studying their responses, an optimized pulse scenario as shown in the graph of FIG. 9B, may be chosen and the final induced fracture network illustrated in FIG. 9C can be predicted.

Figure 10A:
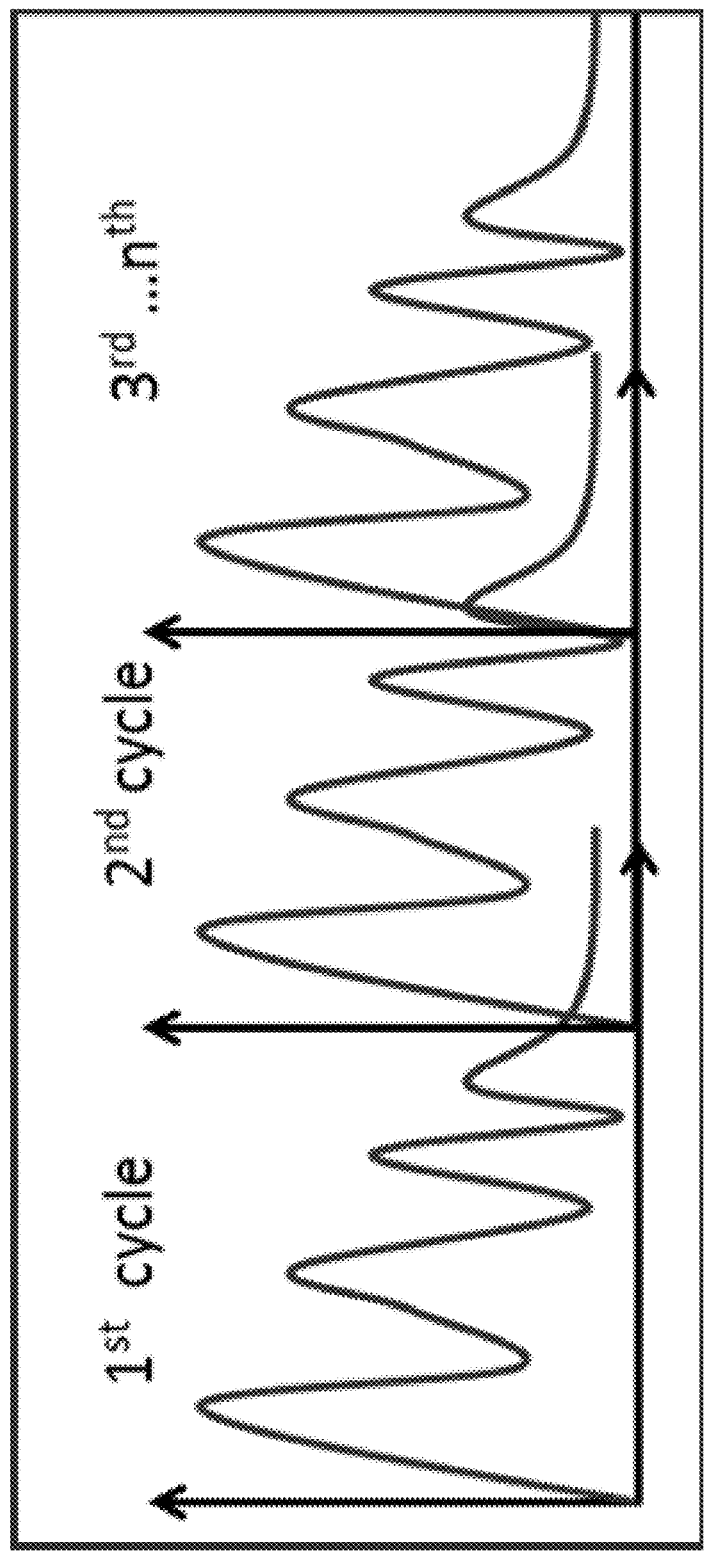
FIG. 10A is a graph showing multiple pulse cycles, according to one or more disclosed embodiments.
Figure 10B:
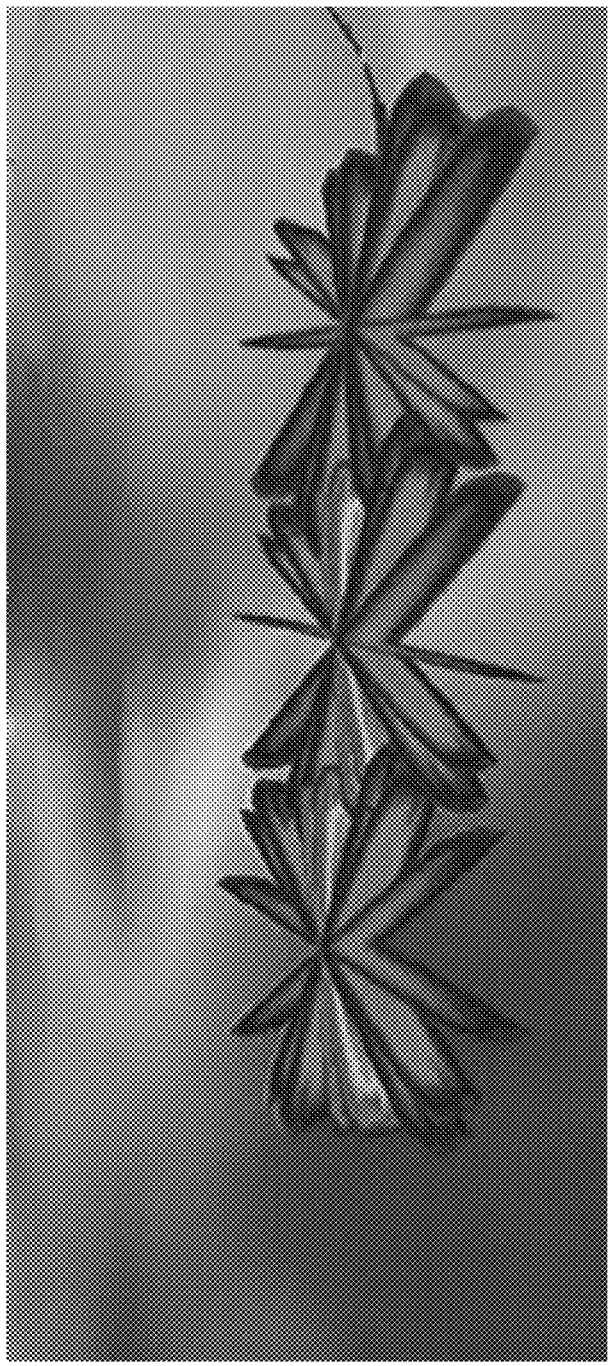
FIG. 10B is a figure illustrating an induced complex and connected fracture network geometry around a horizontal wellbore generated by applying multiple cycles of pulse fracturing load, according to one or more disclosed embodiments.

Pulse fracturing can further be improved by utilizing multiple-cycles/stages of pulse loading. Multiple pulse cycles can increase fracture coverage around the wellbore, promote complexity and fracture interaction therefore maximizing reservoir contact area. This is illustrated in FIGS. 10A-B. FIG. 10A shows a graph demonstrating application of multiple cycles of pulse loading and FIG. 10B illustrates the effects of such loading. FIG. 10B shows a horizontal wellbore. As shown in FIG. 10B, each cycle can produce an extensive network of fracture around a specific area of the wellbore. By applying multiple cycles of pulse loading, multiple fracture networks can be created along the length of the wellbore.

Thus, pulse fracturing utilizing a gaseous medium by using high energy pulses is a viable alternative to hydraulic fracturing, as under a certain reservoir and geomechanical condition, pulse fracturing could be optimized to create multiple fractures that radiate away from the wellbore. The induced fracture network can further be extended into the reservoir by pumping gas at a reduced rate and for an extended amount of time. Coupling of the generated fracture network pattern with a reservoir simulator can further help in quantifying the production efficiency of these fractures, and can serve as a source to compare with the efficiency of hydraulic fractures.

As discussed above, induced fracture potential of a reservoir formation is not a material property but rather a complex function of stress state, loading conditions, loading rate, and material properties. This potential may be quantified within the framework of an integrated model. Such a model may be used to design a pulse fracturing operation with customized pulse rise and decay cycles that can be engineered to optimize fracture complexity and connectivity, trigger ductile to brittle transition, and trigger fracture branching and self-propping mechanisms.

It should also be noted that input parameters mentioned in this disclosure are exemplary. In practice, any parameter that provides information about a specific analysis may be used. As such, some of the parameters mentioned may not be used in alternative embodiments, while others may be replaced by new parameters not mentioned here. Additional parameters may also be added to this list in other embodiments.

In the foregoing description, for purposes of explanation, specific details are set forth in order to provide a thorough understanding of the disclosed embodiments. It will be apparent, however, to one skilled in the art that the disclosed embodiments may be practiced without these specific details. In other instances, structure and devices are shown in block diagram form in order to avoid obscuring the disclosed embodiments. References to numbers without subscripts or suffixes are understood to reference all instance of subscripts and suffixes corresponding to the referenced number. Moreover, the language used in this disclosure has been principally selected for readability and instructional purposes, and may not have been selected to delineate or circumscribe the inventive subject matter, resort to the claims being necessary to determine such inventive subject matter. Reference in the specification to "one embodiment" or to "an embodiment" means that a particular feature, structure, or characteristic described in connection with the embodiments is included in at least one disclosed embodiment, and multiple references to "one embodiment" or "an embodiment" should not be understood as necessarily all referring to the same embodiment.

It is also to be understood that the above description is intended to be illustrative, and not restrictive. For example, above-described embodiments may be used in combination with each other and illustrative process acts may be performed in an order different than discussed. Many other embodiments will be apparent to those of skill in the art upon reviewing the above description. The scope of the invention therefore should be determined with reference to the appended claims, along with the full scope of equivalents to which such claims are entitled. In the appended claims, terms "including" and "in which" are used as plain-English equivalents of the respective terms "comprising" and "wherein."

What is claimed is:

1. A non-transitory program storage device, readable by a processor and comprising instructions stored thereon to cause one or more processors to:
   receive a plurality of input parameters, each input parameter relating to a wellbore in a reservoir formation;
   characterize a portion of the reservoir formation to be fractured in a range of brittle, ductile and a brittle-ductile transition, based on the received input parameters;
   develop a rate and pressure dependent failure model predicting failure for at least the characterized portion based on the received input parameters;
   simulate propagation of a pulse fracturing network in the reservoir formation to determine one or more pulse fracturing rates and loads triggering ductile-to-brittle transition to the characterized portion in the rate and pressure dependent failure model to maximize fracture network extent while minimizing near wellbore damage;
   create a customized pulse fracturing operation based on the one or more pulse fracturing rates and loads determined from the simulation; and
   perform the customized pulse fracturing operation using the one or more pulse fracturing rates and loads on the portion of the reservoir formation.

2. The non-transitory program storage device of claim 1, wherein the failure model comprises predicting rate and pressure dependent failure surfaces.

3. The non-transitory program storage device of claim 1, wherein the failure model comprises predicting tensile failure.

4. The non-transitory program storage device of claim 1, wherein the failure model comprises predicting compactive failure.

5. The non-transitory program storage device of claim 1, wherein the failure model comprises predicting shear failure.

6. The non-transitory program storage device of claim 1, wherein the customized pulse fracturing operation comprises pulse load with a customized pulse rise period using formation specific material properties and rate and pressure dependent failure surfaces.

7. The non-transitory program storage device of claim 1, wherein the customized pulse fracturing operation comprises pulse load with a customized pulse peak using formation specific material properties and rate and pressure dependent failure surfaces.

8. The non-transitory program storage device of claim 1, wherein the customized fracturing operation comprises pulse load with a customized number of pulse cycles using formation specific properties and rate and pressure dependent failure surfaces.

9. The non-transitory program storage device of claim 1, wherein the input parameters comprise at least one of Young's Modulus, Poisson's ratio, porous rock density, rock gain density, unconfined compressive strength, cohesion, internal friction angle, formation anisotropy, and natural fracture characteristics.

10. The non-transitory program storage device of claim 1, wherein the instructions further cause the one or more processors to predict a fracture potential of a reservoir formation under pulse fracturing application.

11. The non-transitory program storage device of claim 1, wherein the input parameters are ranked and weighted.

12. A method implemented with a processing system for performing a pulse fracturing operation with at least one pulse source, the method comprising:
receiving, with the processing system, a plurality of input parameters, each input parameter relating to a wellbore in a reservoir formation;
characterizing, with the processing system, a portion of the reservoir formation to be fractured in a range of brittle, ductile and a brittle-ductile transition, based on the received input parameters;
developing, with the processing system, a rate and pressure dependent failure model predicting failure for at least the characterized portion based on the received input parameters;
simulating, with the processing system, propagation of a pulse fracturing network in the reservoir formation to determine one or more pulse fracturing rates and loads triggering ductile-to-brittle transition to the characterized portion in the rate and pressure dependent failure model to maximize fracture network extent while minimizing near wellbore damage;
creating, with the processing system, a customized pulse fracturing operation based on the one or more pulse fracturing rates and loads determined from the simulation; and
performing, with the processing system and the at least one pulse source, the customized pulse fracturing operation using the one or more pulse fracturing rates and loads on the one or more zones of the reservoir formation.

13. The method of claim 12, wherein the failure model comprises predicting rate and pressure dependent failure surfaces.

14. The method of claim 12, wherein the failure model comprises predicting tensile failure.

15. The method of claim 12, wherein the failure model comprises predicting compactive failure.

16. The method of claim 12, wherein the failure model comprises predicting shear failure.

17. The method of claim 12, wherein the customized pulse fracturing operation comprises pulse load with a customized pulse rise period using formation specific properties and rate and pressure dependent failure surfaces.

18. The method of claim 12, wherein the customized pulse fracturing operation comprises pulse load with a customized pulse peak using formation specific properties and rate and pressure dependent failure surfaces.

19. The method of claim 12, wherein the customized pulse fracturing operation comprises pulse load with a customized number of pulse cycles using formation specific properties and rate and pressure dependent failure surfaces.

20. The method of claim 12, wherein the input parameters comprise at least one of Young's Modulus, Poisson's ratio, porous rock density, rock gain density, unconfined compressive strength, cohesion, internal friction angle, formation anisotropy, and natural fracture characteristics.

21. The method of claim 12, further comprising predicting a fracture potential of the wellbore under pulse fracturing application.

22. The method of claim 12, wherein the input parameters are ranked and weighted.

23. A system, comprising:
a memory;
a display device; and
a processor operatively coupled to the memory and the display device and adapted to execute program code stored in the memory to:
receive a plurality of input parameters, each input parameter relating to a wellbore in a reservoir formation;
characterize a portion of the reservoir formation to be fractured in a range of brittle, ductile and a brittle-ductile transition, based on the received input parameters;
develop a rate and pressure dependent failure model predicting failure of at least the characterized portion based on the received input parameters;
simulate propagation of a pulse fracturing fracture network in the reservoir formation to determine one or more pulse fracturing rates and loads triggering ductile-to-brittle transition to the characterized portion in the rate and pressure dependent failure model to maximize fracture network extent while minimizing near wellbore damage;
create a customized pulse fracturing operation based on the one or more pulse fracturing rates and loads determined from the simulation; and
perform the customized pulse fracturing operation using the one or more pulse fracturing rates and loads on the wellbore.

24. The system of claim 23, wherein the failure model comprises predicting rate and pressure dependent failure surfaces.

25. The system of claim 23, wherein the failure model comprises predicting tensile failure.

26. The system of claim 23, wherein the failure model comprises predicting compactive failure.

27. The system of claim 23, wherein the failure model comprises predicting shear failure.

28. The system of claim 23, wherein the customized pulse fracturing operation comprises pulse load with a customized pulse rise period using formation specific material properties and rate and pressure dependent failure surfaces.

29. The system of claim 23, wherein the customized pulse fracturing operation comprises pulse load with a customized pulse peak using formation specific material properties and rate and pressure dependent failure surfaces.

30. The system of claim 23, wherein the customized fracturing operation comprises pulse load with a customized number of pulse cycles using formation specific properties and rate and pressure dependent failure surfaces.

31. The system of claim 23, wherein the input parameters comprise at least one of Young's Modulus, Poisson's ratio, porous rock density, rock gain density, unconfined compressive strength, cohesion, internal friction angle, formation anisotropy, and natural fracture characteristics.

32. The system of claim 23, further comprising predicting a fracture potential of the wellbore under pulse fracturing application.

33. The system of claim 23, wherein the input parameters are ranked and weighted.

* * * * *